(12) United States Patent
Chen et al.

(10) Patent No.: US 8,779,801 B2
(45) Date of Patent: Jul. 15, 2014

(54) ANALOG SIGNAL SOFT SWITCHING CONTROL WITH PRECISE CURRENT STEERING GENERATOR

(71) Applicant: STMicroelectronics (Shenzhen) R&D Co. Ltd., Shenzhen (CN)

(72) Inventors: Min Chen, Shenzhen (CN); Wen Liu, Nanshan (CN); HongXia Li, Shenzhen (CN); XiaoWu Dai, Shenzhen (CN)

(73) Assignee: STMicroelectronics (Shenzhen) R&D Co. Ltd., Shenzhen (CN)

( * ) Notice: Subject to any disclaimer, the term of this patent is extended or adjusted under 35 U.S.C. 154(b) by 0 days.

(21) Appl. No.: 13/692,702

(22) Filed: Dec. 3, 2012

(65) Prior Publication Data

US 2013/0187681 A1    Jul. 25, 2013

(30) Foreign Application Priority Data

Dec. 31, 2011    (CN) .......................... 2011 1 0461895

(51) Int. Cl.
*G01R 19/00*    (2006.01)
(52) U.S. Cl.
USPC ................... 327/53; 327/65; 327/67; 327/73; 327/170; 327/310; 330/255; 330/257; 330/262; 330/265

(58) Field of Classification Search
USPC ........... 327/53, 50, 52, 54, 63, 65, 67, 69, 70, 327/72, 73, 99, 105, 170, 180, 309, 310, 327/355, 358, 363, 560, 561, 563, 129, 130, 327/131, 132, 134, 137; 330/255, 257, 259, 330/260, 261, 262, 263, 265, 267, 270, 271, 330/282, 285, 290, 291, 295, 78, 81, 82, 83, 330/131
See application file for complete search history.

(56) References Cited

U.S. PATENT DOCUMENTS 4,959,623 A * 9/1990 Khoury ......................... 330/265
6,337,647 B1 * 1/2002 Masson et al. ................ 341/150

* cited by examiner

*Primary Examiner* — Lincoln Donovan
*Assistant Examiner* — Jung H Kim
(74) *Attorney, Agent, or Firm* — Hogan Lovells US LLP

(57) ABSTRACT

A switching circuit includes a first input stage having an input for receiving a first input signal, an output, and a power terminal for receiving an increasing analog current, a second input stage having an input for receiving a second input signal, an output, and a power terminal for receiving a decreasing analog current, and an output node coupled to the outputs of the first input stage and the second input stage for providing a switched output signal. An output stage is coupled between the first and second input stages and the output node. The first and second input stages are operational amplifiers.

6 Claims, 9 Drawing Sheets

US 8,779,801 B2

ANALOG SIGNAL SOFT SWITCHING CONTROL WITH PRECISE CURRENT STEERING GENERATOR

RELATED APPLICATION

This application is a translation of and claims the priority benefit of Chinese patent application number 201110461895.5, filed on Dec. 31, 2011, entitled Analog Signal Soft Switching Control Circuit With A Precise Current Steering Generator, which is hereby incorporated by reference to the maximum extent allowable by law.

FIELD OF THE INVENTION

The present invention relates to analog switching circuits and more particularly to an analog soft switching control circuit having a precise current steering generator.

BACKGROUND OF THE INVENTION

A classical implementation of switching between two signals V1 and V2 could be a direct switching with a logical control as shown in circuit 100 of FIG. 1. Two CMOS switches S1 and S2 are used and they are controlled by a reversed logical control signal (CTRL and inverted CTRL through inverter 102). Either signal V1 or V2 is passed through operational amplifier 104 to provide the VOUT output signal. If the two signals have different signal voltages, there will be a jump or step at the output point 106. In some applications, this jump or step of the output signal could create a problem. For example, in an audio application, if the output signal goes to a speaker, the jump will create an undesirable pop noise at the speaker. In this case, a smooth transition between the two input signals is obviously preferred.

A traditional digital solution 200 for a smooth transition between switched input signals uses resistor networks 212 and 214, as well as corresponding switching networks 216 and 218 to divide a big step into small ones as shown in FIG. 2. Circuit 200 includes an input for receiving a first input signal V1, and a second input for receiving a second input signal V2. Circuit 200 also includes an output operational amplifier or buffer 204, soft-switching clock generator 206, a switch counter 208, and a logic controller 210. Circuit 200 also typically includes a final post processing low pass filter 220. By increasing the number of small steps and the soft-switching time, the pop noise is reduced. In the solution shown in FIG. 2, the resistors and parasitic components will deteriorate performance due to increased noise and Total Harmonic Distortion (THD). For some configurations of step numbers and soft-switching times, undesired audio tones are generated. A low pass filter is needed to remove high frequency digital spikes associated with circuit 200. The digital circuit 200 shown in FIG. 2 presents difficult trade-offs between pop noise and other performance considerations.

What is desired, therefore, is a simple analog switching circuit for providing a smooth transition between two input signals, and without the need for any post-processing or filtering, or without the use of complex digital circuitry.

SUMMARY OF THE INVENTION

According to the present invention, a signal switching circuit and method based on analog current transition is presented, which can be utilized in many applications, such as audio applications, to switch from one signal to another with a smooth transition.

A switching circuit comprises a first input stage having an input for receiving a first input signal, an output, and a power terminal for receiving an increasing analog current, a second input stage having an input for receiving a second input signal, an output, and a power terminal for receiving a decreasing analog current, and an output node coupled to the outputs of the first input stage and the second input stage for providing a switched output signal. An output stage is interposed between the first and second input stages and the output node. The first and second input stages each comprise an operational amplifier.

A corresponding switching method comprises applying a first input signal to a first input stage, applying an increasing analog current to a power terminal of the first input stage, applying a second input signal to a second input stage, applying a decreasing analog current to a power terminal of the second input stage, and combining output signals from the first input stage and the second input stage to provide a switched output signal. The switched output signal can be buffered, and the first and second input stages can comprise operational amplifiers.

According to an embodiment of the present invention, the switching circuit can comprise a current generator for receiving a clock signal and for generating a charge current and a discharge current, a voltage generator for receiving the charge and discharge current and for providing a control voltage, a voltage-to-current generator for receiving the control voltage and for providing a first analog current and a second analog current, and an amplifier stage for combining the first and second analog currents and for providing a switched output signal.

The current generator comprises first and second integrators having inputs switched by the clock signal, two additional voltage-to-current generators having outputs switched by the clock signal, and first and second current mirrors having inputs switched by the clock signal.

The voltage generator comprises first and second current mirrors, receives two additional clock signals, and comprises a load capacitor.

The voltage-to-current generator comprises a differential amplifier for receiving the control voltage, a reference voltage, and for providing the first and second analog currents, as well as first and second current mirrors.

The amplifier stage comprises first and second input stages, and an output stage coupled to outputs of the first and second input stages. Each of the stages can comprise an operational amplifier or buffer.

According to the present invention, the first analog current comprises an analog current increasing from a first value to a second value, and the second analog current comprises an analog current decreasing from the second value to the first value.

DETAILED DESCRIPTION

The switching circuit and method according to the present invention provides a novel way to achieve a smooth transition in switching between input signals, but without the mentioned drawbacks of the traditional prior art solutions. According to the present invention, the transition curve is very smooth and can be controlled precisely. The related block diagram of a circuit according to the present invention is shown in four parts represented by FIGS. 3A, 3B, 3C, and 3D.

Figure 1:
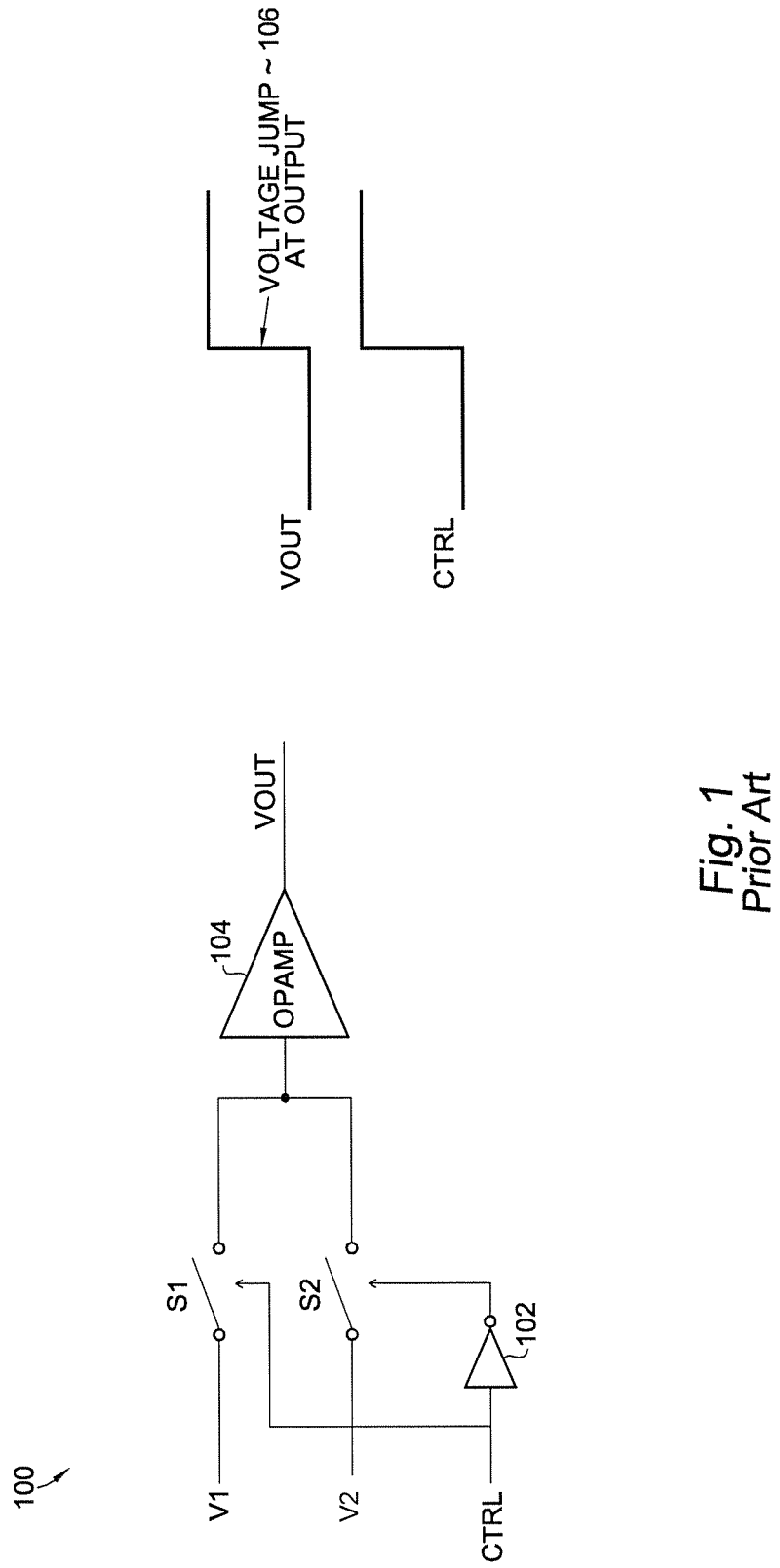
FIG. 1 is a schematic diagram of a prior art switching circuit and corresponding switching waveform.
Figure 2:
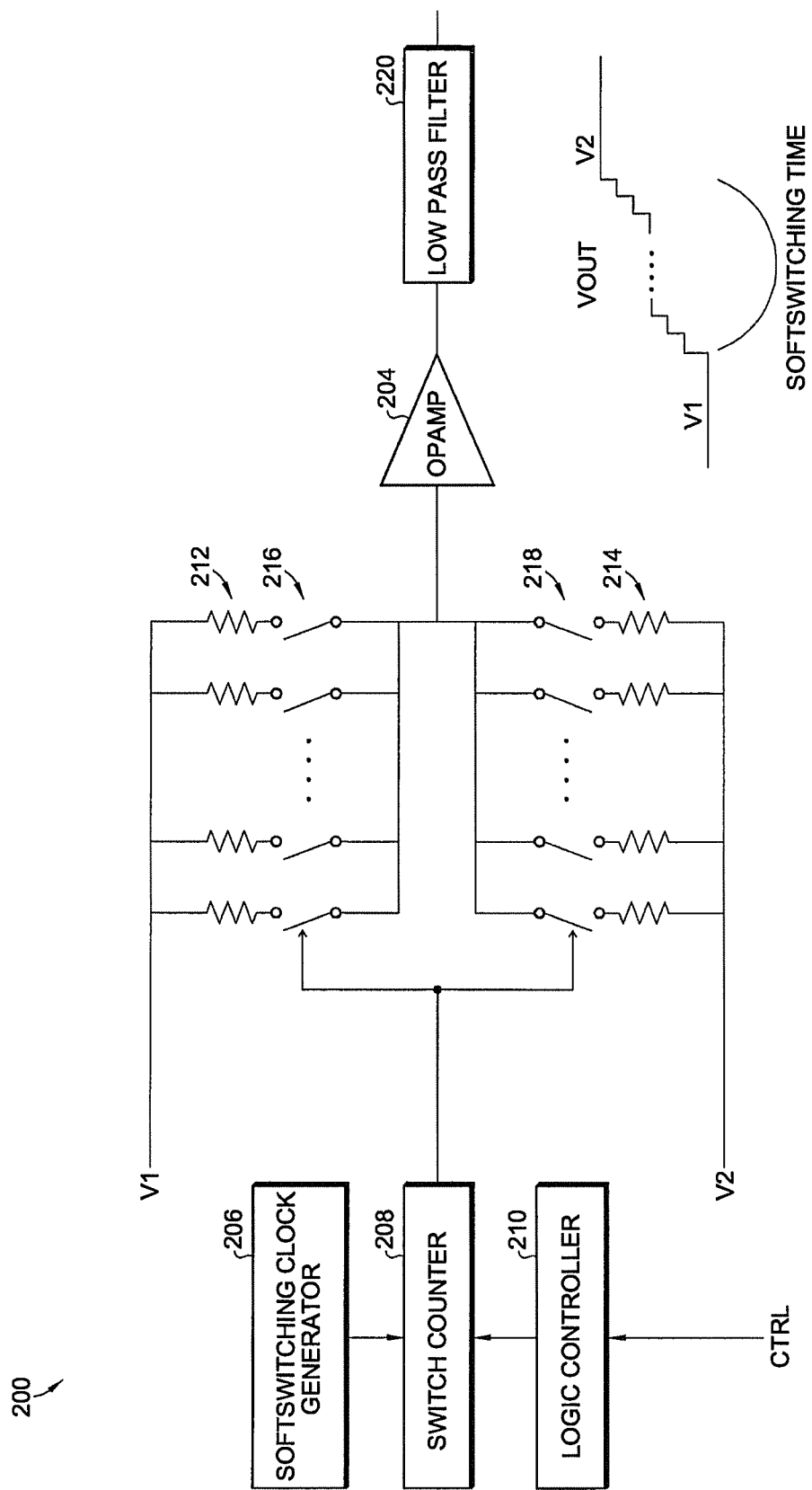
FIG. 2 is a schematic diagram of a prior art digital switching circuit and corresponding switching waveform.
Figure 3A:
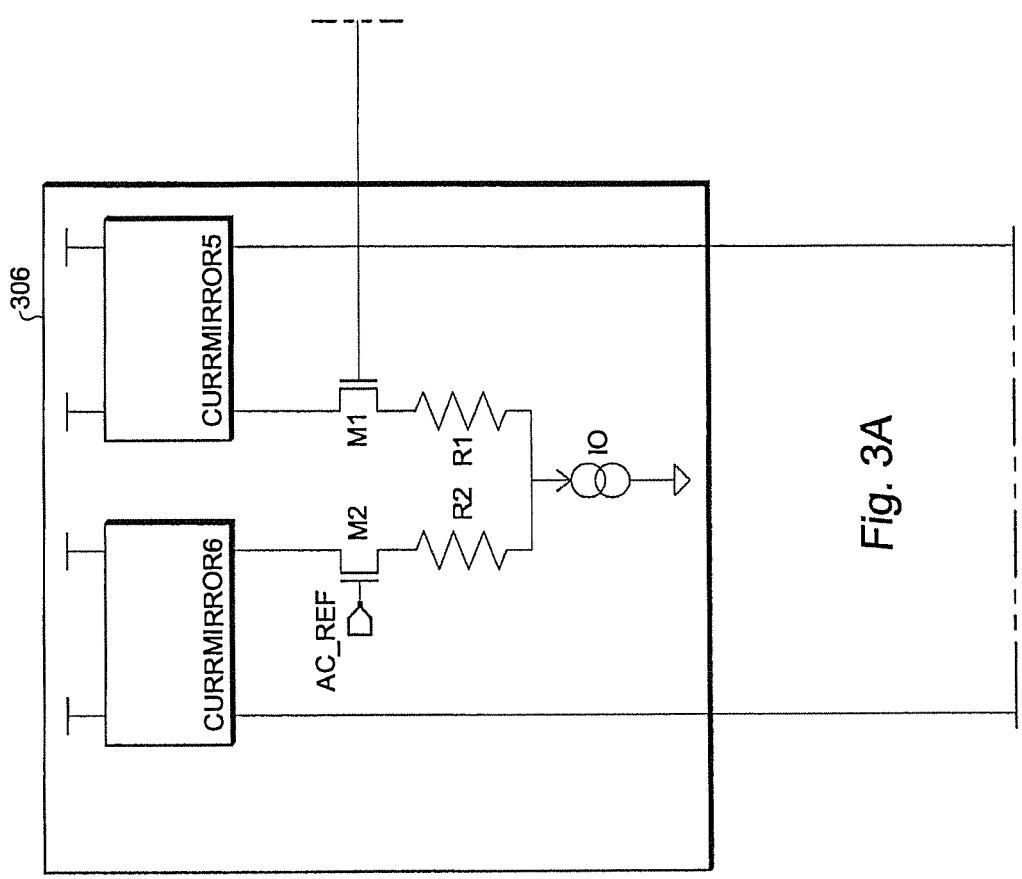
FIG. 3 is FIGS. 3A, 3B, 3C, and 3D taken together and is a schematic diagram of a switching circuit according to the present invention.
Figure 3B:
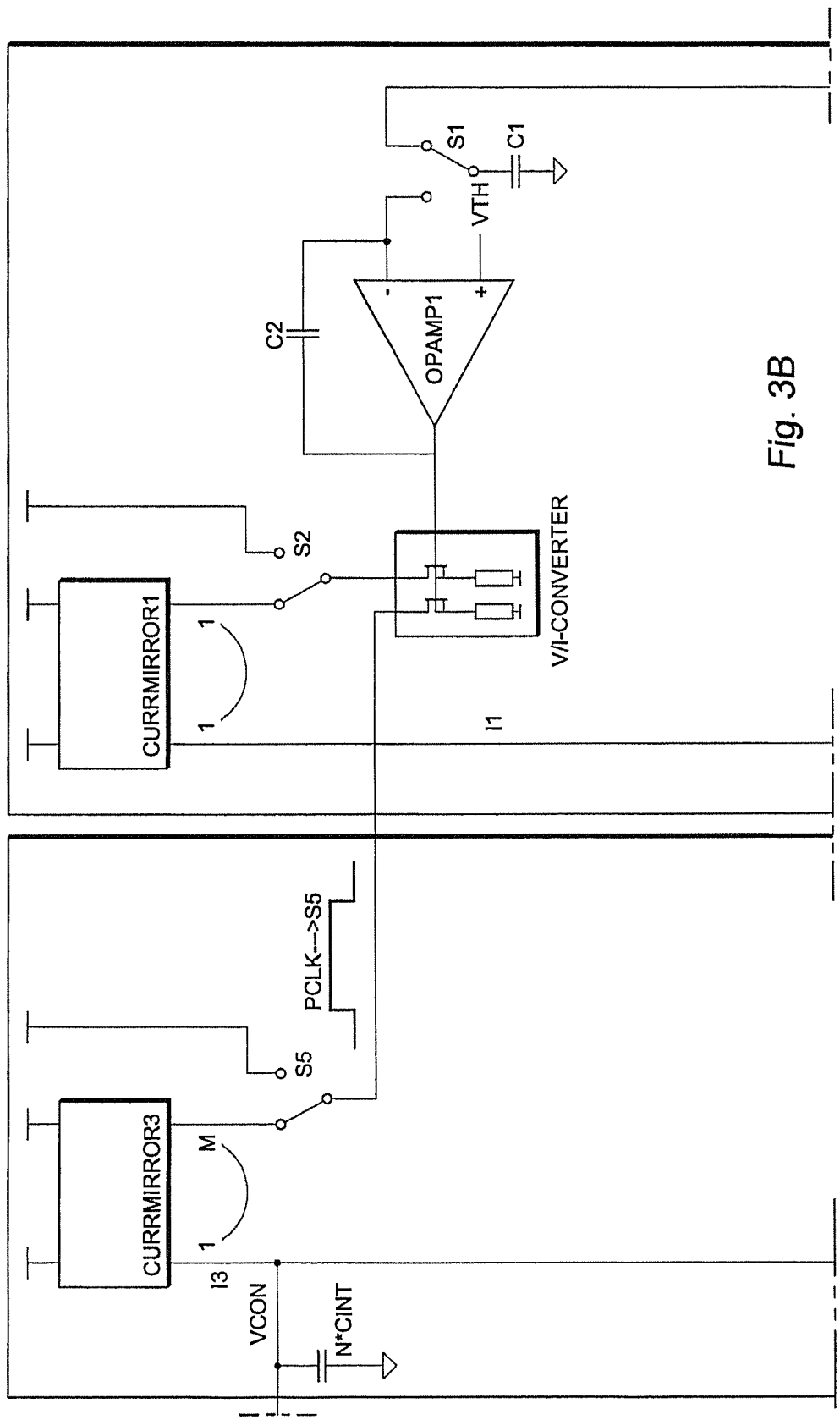
Figure 3C:
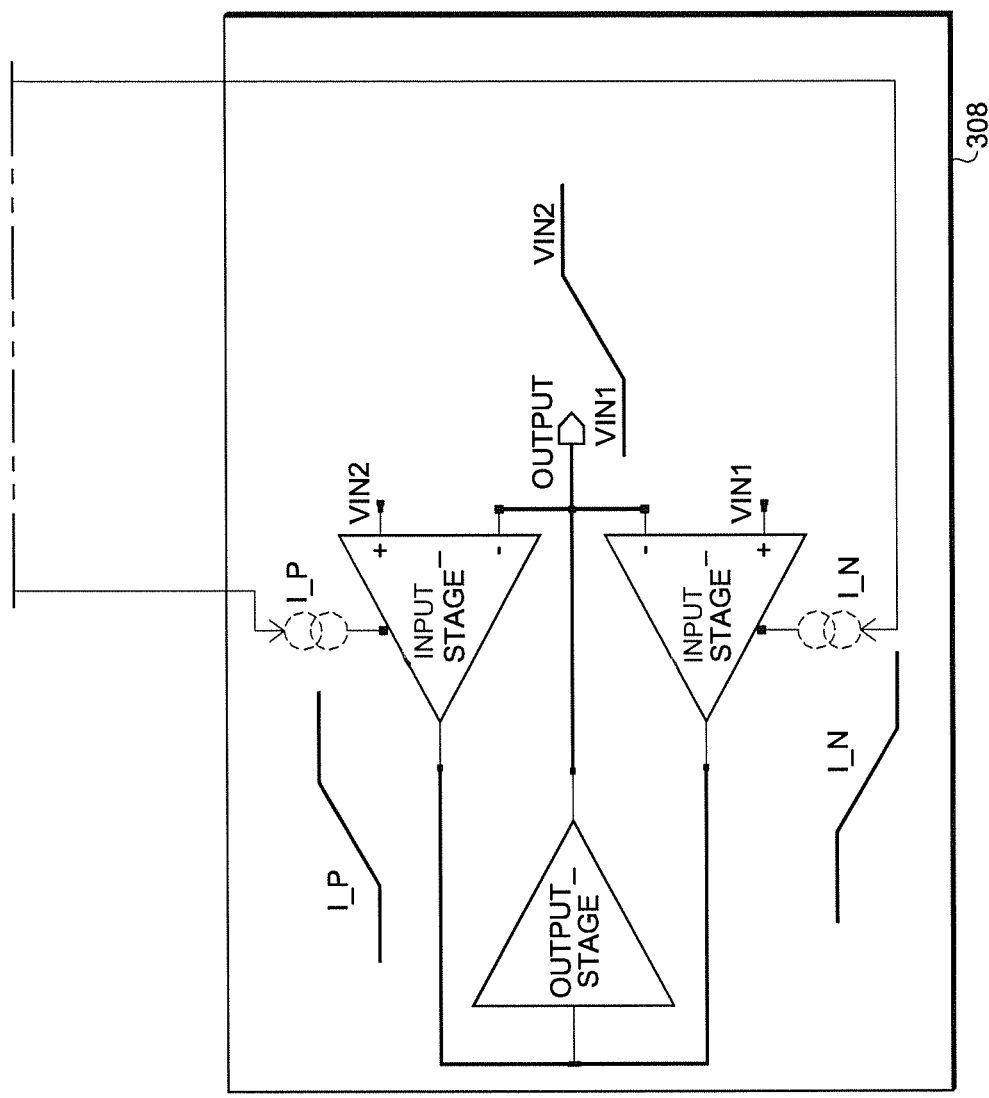
Figure 3D:
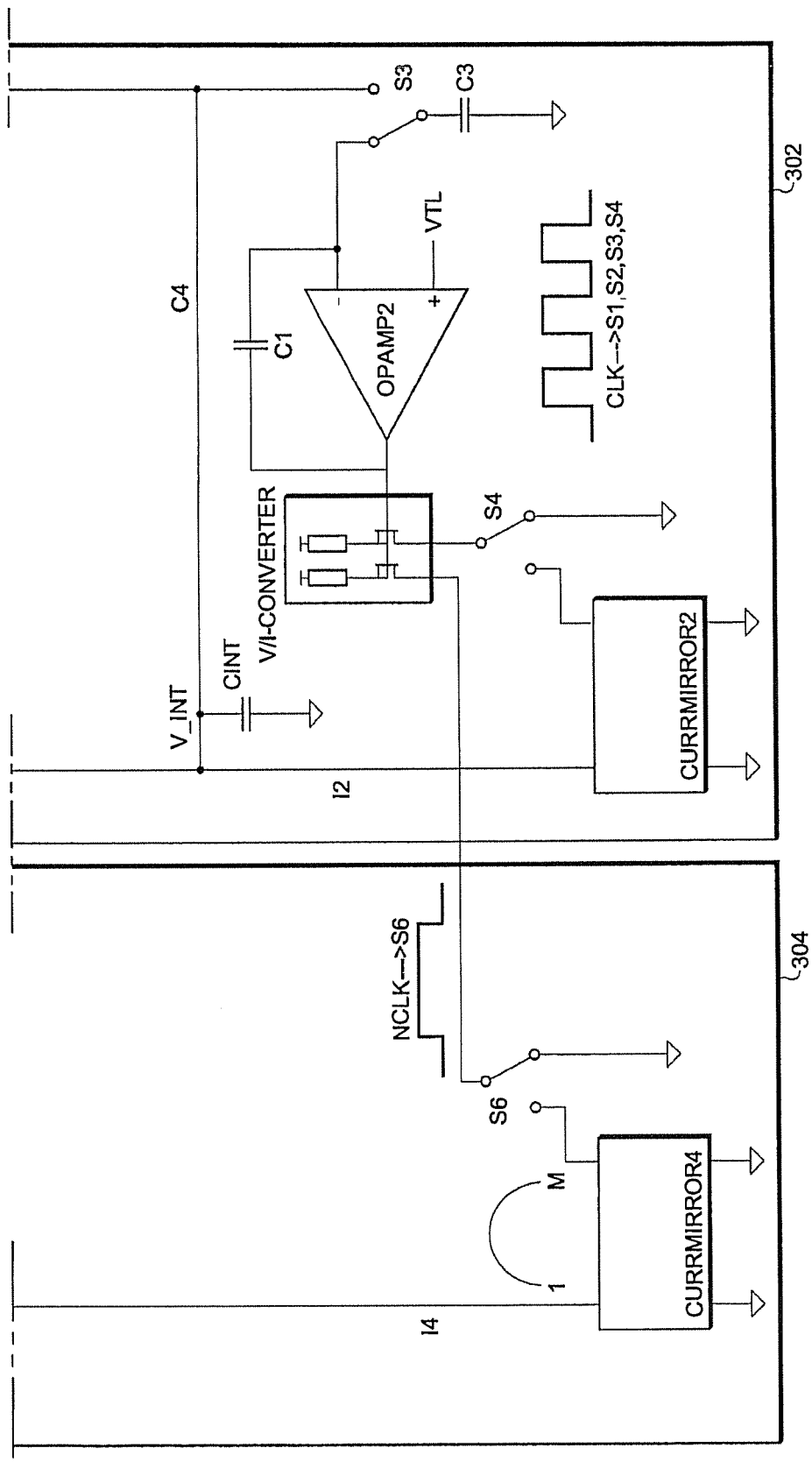

The block diagram of the circuit is comprised of four parts: a charge/discharge current reference generator 302 shown in FIGS. 3B and 3D; a voltage generator with configurable charge/discharge timing 304 shown in FIGS. 3B and 3D; a voltage to current convertor 306 shown in FIG. 3A; and an amplifier stage 308 for implementing the smooth transition of signal switching shown in FIG. 3C.

The signal switching from VIN1 to VIN2 is controlled by an operational amplifier input stage current transition. One input stage current I_N is changed from 10 to zero, and the other input stage current I_P is changed from zero to 10. Consequently the output signal is changed from VIN1 to VIN2 smoothly. The positive input of the I_N input stage receives the VIN1 input voltage, and the positive input of the I_P input stage receives the VIN2 input voltage. The negative inputs are coupled together and to the output of the output stage, as shown. The output stage buffers the switching signal to provide the OUTPUT switched voltage.

Two currents I_P and I_N are generated, which have selective transition timing.

A clock signal CLK with configurable frequency and duty cycle is used to control two integrators and provide current generation of currents I1 and I2. OPAMP1, switch S1, and capacitors C1 and C2 comprise a first switched capacitor integrator. OPAMP2, switch S3, and capacitors C3 and C4 comprise a second switched capacitor integrator. When switch S1 is in the right position and switch S2 is in the left position, voltage V_Int will be charged from a first voltage VTL to a second voltage VTH through capacitor C1 and Cint with charge current I1. When switch S1 is turned to the left position and switch S2 is turned to the right position, capacitor C1 is coupled to the negative input of OPAMP1. The previous value of the V_Int voltage stored on capacitor C1 will be compared with VTH voltage, and the first switched capacitor integrator will make an adjustment for the next charging current I1 until the V_Int voltage is accurately charged to VTH.

When switch S3 is turned to the right position and switch S4 is turned to the left position, voltage V_Int will be discharged from VTH to VTL through capacitors C3 and Cint with discharge current I2. When switch S3 is turned to the left position and switch S4 is turned to the right position, capacitor C3 is coupled to the negative input of OPAMP2, the previous V_Int voltage stored on capacitor C3 will be compared with VTL The second switched capacitor integrator will make an adjustment for the next discharging current I2 until V_Int is accurately discharged to VTL.

The current generator 302 thus includes two integrators, two voltage-to-current converters, and two current mirrors CURRMIRROR1 and CURRMIRROR2 as shown.

Under the control of two switched capacitor integrators and two phase non-overlap clocks from CLK, V_Int will generate a triangle voltage which fluctuates between VTH and VTL, its charge/discharge time will be decided by CLK frequency and its charge/discharge time ratio is defined by CLK duty cycle D (D=0 to 1). Here the charge current I1 and the discharge current I2 will be adjusted until it is constant.

The fixed current reference I1 and I2 will be mirrored to currents I3 and I4 by the ratio of 1/M which is configurable. Current mirrors CURRMIRROR3 and CURRMIRROR4 are used for this purpose. Voltage $V_{CON}$ will be charged or discharged by currents I3 and I4. Load capacitor N*Cint is configurable.

PCLK and NCLK can be selected as follows:

I3=I1/M; If PCLK pulse width=N*M*D/fCLK, then $V_{CON}$ will be accurately charged from VTL to VTH under PCLK pulse control.

I4=I2/M; If NCLK pulse width=N*M*(1−D)/fCLK, then $V_{CON}$ will be accurately discharged from VTH to VTL under NCLK pulse control.

When applying PCLK and NCLK with a selective ratio of M and N, the Vcon voltage transition will be obtained from VTH discharging to VTL or VTL charging to VTH within the requested timing of PCLK and NCLK.

Transistors M1 and M2 comprise a source-coupled transistor pair with source degeneration (resistors R1 and R2, receiving bias current $I_O$). The $V_{CON}$ voltage will be applied to the M1 gate input, and it will generate a differential pair of currents I_P and I_N. The currents are mirrored through current mirrors CURRMIRROR5 and CURRMIRROR6.

The current transition time will be decided by the PCLK and NCLK pulse widths. The width is defined by N (numbers of capacitor Cint), M (the current mirror factor of current mirrors CURRMIRROR3 and CURRMIRROR4), the duty cycle of the CLK signal, and the frequency of the CLK signal. A wide timing range can be achieved by the presence of all of these settings. The transition timing, therefore, is technology independent which will not be affected by resistor and capacitor variations.

Figure 4:
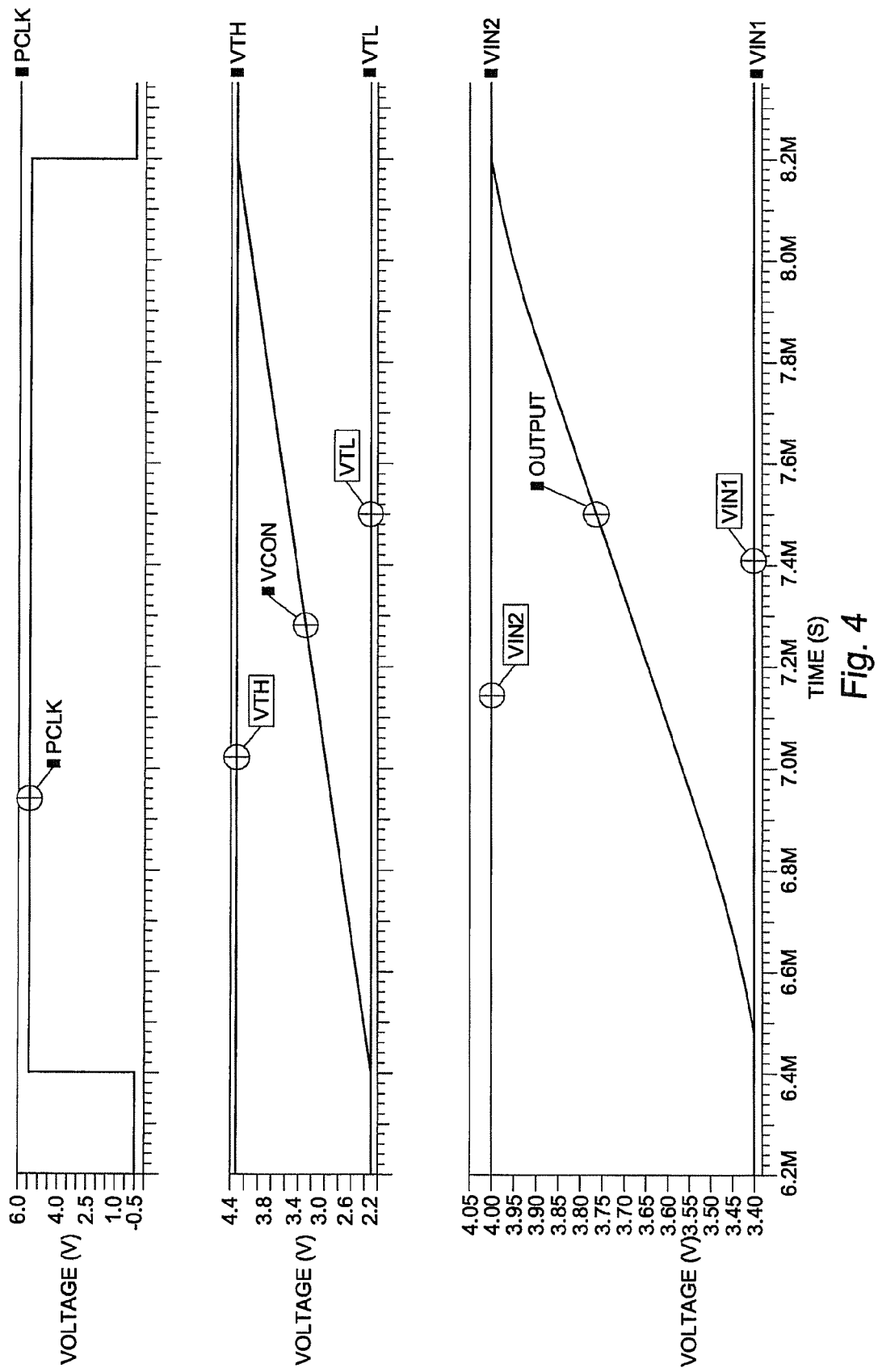
FIG. 4 is a simulation result of a signal jump transition for a DC input according to the present invention.
Figure 5:
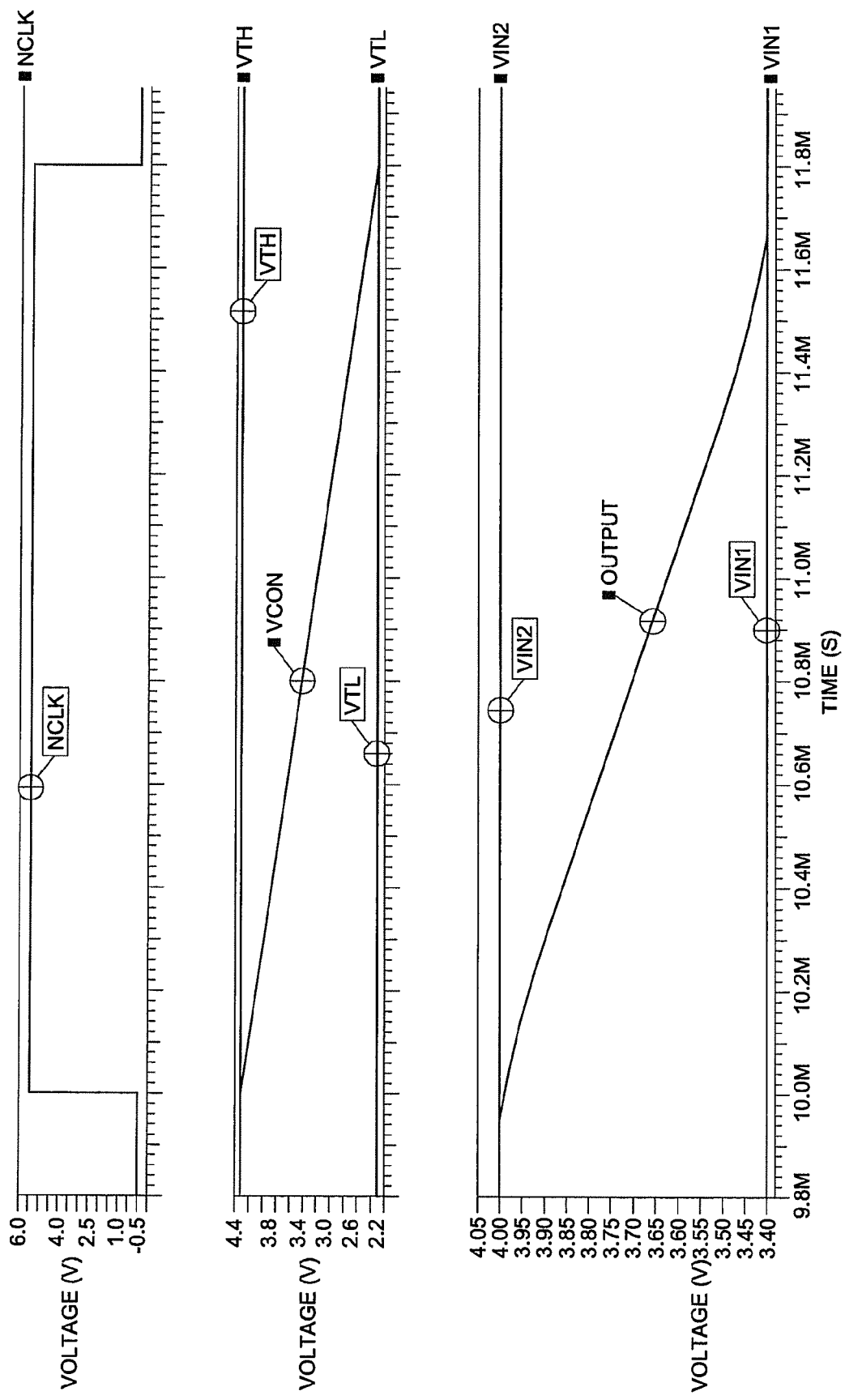
FIG. 5 is a simulation result of a signal drop transition for a DC input according to the present invention.

FIG. 4 and FIG. 5 are timing diagrams that show the smooth transition between two DC input signals.

In FIG. 4, an upper portion of the graph shows the PCLK signal, the middle portion of the graph shows the smooth transition of the $V_{CON}$ voltage between a first voltage VTL and a second voltage VTH, and the bottom portion of the graph shows the smooth transition of the output signal between a first input voltage VIN1 and a second input voltage VIN2. FIG. 4 thus shows switching wherein there is a step up between the DC input voltage signals.

In FIG. 5, an upper portion of the graph shows the NCLK signal, the middle portion of the graph shows the smooth transition of the $V_{CON}$ voltage between a first voltage VTH and a second voltage VTL, and the bottom portion of the graph shows the smooth transition of the output signal between a first input voltage VIN2 and a second input voltage VIN1. FIG. 5 thus shows switching wherein there is a step down between the DC input voltage signals.

Figure 6:
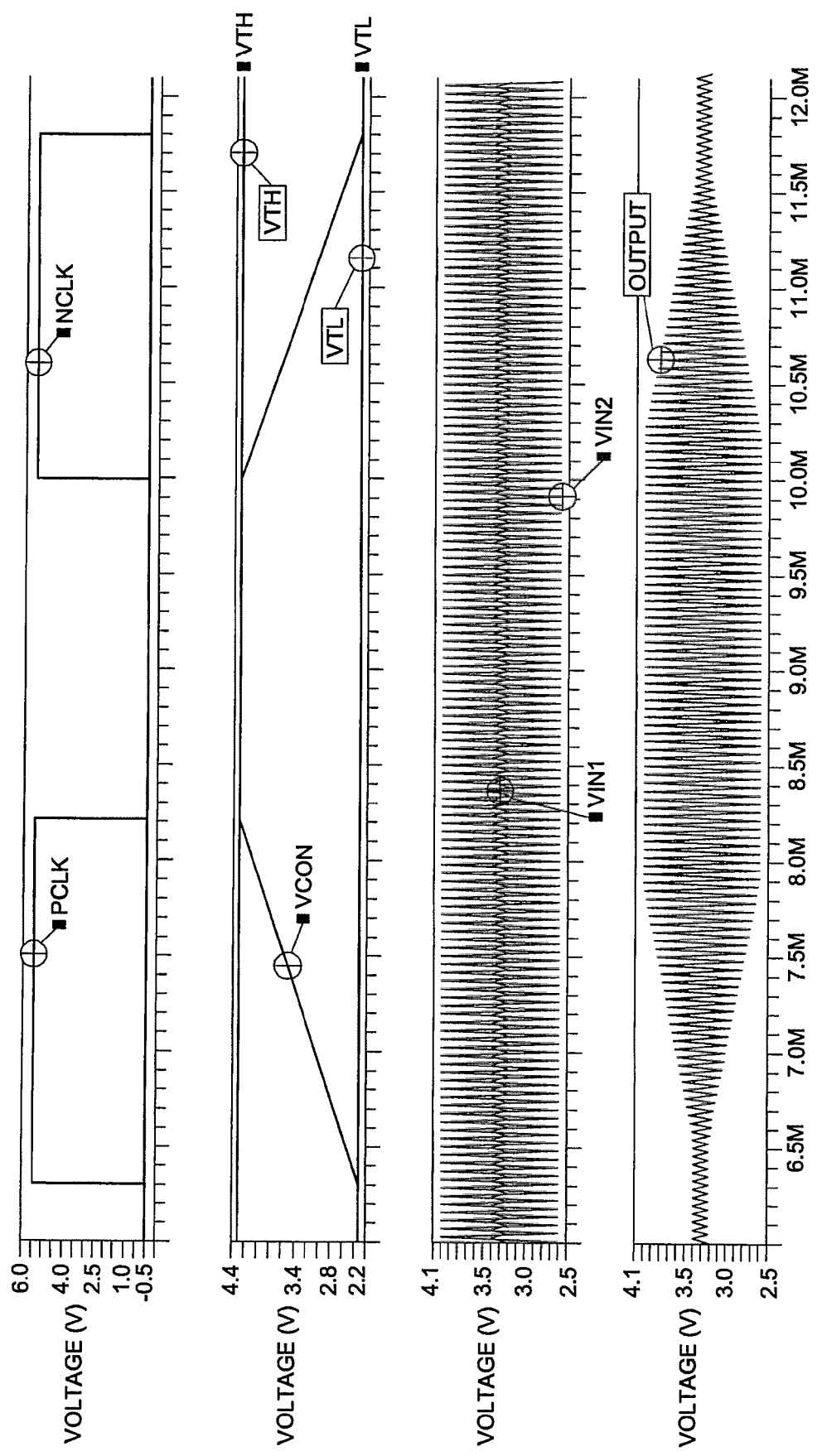
FIG. 6 is a simulation result of a signal transition for a sine wave input according to the present invention.

FIG. 6 shows the smooth transition between two sin wave inputs.

In FIG. 6, a first and top portion of the graph shows the NCLK and PCLK signals. A second portion of the graph shows the smooth transition of the $V_{CON}$ voltage between a first voltage VTL and a second voltage VTH, and back to the VTL voltage. A third portion of the graph shows the sine wave input voltages VIN1 and VIN2. The fourth and bottom portion of the graph shows the smooth transition of the output signal between the first input sine wave voltage VIN1 and the second input sine wave voltage VIN2, and then back down to the VIN1 sine wave voltage. FIG. 6 thus shows smooth switching from one sine wave voltage input to another, and back to the first sine wave voltage input.

Thus, according to the present invention, smooth signal switching is provided, controlled by an operational amplifier analog current transition. Reference current transition timing is precisely controlled by clock frequency and duty cycle. A wide range of transition time can be achieved by setting N (capacitor numbers) and M (current mirror factor). The circuit of the present invention is substantially immune to high frequency digital noise, and there is no need to filter the output stage voltage. The switching transition time is independent of technology (resistor and capacitor) variations. The circuit of the present invention is easy to implement and cost effective.

It will be apparent to those skilled in the art, therefore, that various modifications and variations can be made to the invention without departing from the spirit or scope of the invention. Thus, it is intended that the present invention covers the modifications and variations of this invention provided they come within the scope of the appended claims.

We claim:

1. A switching circuit comprising:
    a first input stage having an input for receiving a first input signal, an output, and a power terminal for receiving an increasing analog current;
    a second input stage having an input for receiving a second input signal, an output, and a power terminal for receiving a decreasing analog current;
    an output node coupled to the outputs of the first input stage and the second input stage for providing a switched output signal;
    a differential stage having an input for receiving a linearly ramped input voltage traversing from a first voltage to a second voltage, a first current output, and a second current output;
    a ramped voltage output circuit for providing the linearly ramped input voltage to the input of the differential stage;
    a first current mirror having an input coupled to the first current output of the differential stage and an output coupled to the power terminal of the first input stage; and
    a second current mirror having an input coupled to the second current output of the differential stage and an output coupled to the power terminal of the second input stage.

2. The switching circuit of claim 1 further comprising an output stage interposed between the first and second input stages and the output node.

3. The switching circuit of claim 1 wherein the first and second input stages each comprises an operational amplifier.

4. A switching method comprising:
    applying a first input signal to a first input stage;
    applying an increasing analog current to a power terminal of the first input stage;
    applying a second input signal to a second input stage;
    applying a decreasing analog current to a power terminal of the second input stage;
    combining output signals from the first input stage and the second input stage to provide a switched output signal;
    providing a differential stage having an input for receiving a linearly ramped input voltage traversing from a first voltage to a second voltage, a first current output, and a second current output;
    providing the linearly ramped input voltage to the input of the differential stage;
    providing a first current mirror having an input coupled to the first current output of the differential stage and an output coupled to the power terminal of the first input stage; and
    providing a second current mirror having an input coupled to the second current output of the differential stage and an output coupled to the power terminal of the second input stage.

5. The switching method of claim 4 further comprising buffering the switched output signal.

6. The method of claim 4 wherein the first and second input stages each comprises an operational amplifier.

* * * * *